(12) United States Patent
Iino et al.

(10) Patent No.: US 6,590,381 B1
(45) Date of Patent: Jul. 8, 2003

(54) CONTACTOR HOLDING MECHANISM AND AUTOMATIC CHANGE MECHANISM FOR CONTACTOR

(75) Inventors: Shinji Iino, Kitakoma-gun (JP); Junichi Hagihara, Sendai (JP); Kiyoshi Takekoshi, Nishiyatsushiro-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/646,951
(22) PCT Filed: Jan. 28, 2000
(86) PCT No.: PCT/JP00/00442
§ 371 (c)(1), (2), (4) Date: Sep. 25, 2000
(87) PCT Pub. No.: WO00/45433
PCT Pub. Date: Aug. 3, 2000

(30) Foreign Application Priority Data

Jan. 29, 1999 (JP) .............................. 11/022985
Oct. 19, 1999 (JP) ........................... 11-296484

(51) Int. Cl.⁷ ..................... G01R 31/02; G01R 31/26
(52) U.S. Cl. .................... 324/158.1; 324/754; 324/765; 439/41
(58) Field of Search ................ 324/754, 755, 324/757, 758, 761, 765, 158.1; 439/41

(56) References Cited

U.S. PATENT DOCUMENTS 5,027,063 A * 6/1991 Letourneau ................. 324/754
5,489,853 A * 2/1996 Nakajima .................... 324/754

* cited by examiner

*Primary Examiner*—Kamand Cuneo
*Assistant Examiner*—Russell M. Kobert
(74) *Attorney, Agent, or Firm*—Oblon, Spivak, McClelland, Maier & Neustadt, P.C.

(57) ABSTRACT

Disclosed are a holding mechanism of a contactor and an automatic renewing mechanism of a contactor provided with the holding mechanism of the contactor. The contactor holding mechanism includes a frame (11) fixed to a performance board (P), a plurality of latch mechanisms (13) for holding the contactor inside the frame, and a suction fixing mechanism (14) for fixing the contactor held by the latch mechanisms inside the frame by a vacuum suction force. The automatic renewing mechanism of the contactor includes a holding mechanism (10) for detachably holding the contactor, and a delivery mechanism (16) for delivering the contactor (12) to and from the holding mechanism. Further, the delivery mechanism includes a suction holding section (17) for holding the contactor (12) by suction, an arm (18) having the suction holding section formed at the distal end portion and arranged swingable and movable in a vertical direction, and an arm driving section (19) for swinging and moving in a vertical direction the arm (18).

20 Claims, 8 Drawing Sheets

CONTACTOR HOLDING MECHANISM AND AUTOMATIC CHANGE MECHANISM FOR CONTACTOR

TECHNICAL FIELD

The present invention relates to a holding mechanism and an automatic renewing mechanism of a contactor in an inspection apparatus, more particularly, to a holding mechanism and an automatic renewing mechanism of a contactor used for inspecting the electrical characteristics of a target object to be processed such as a highly integrated semiconductor wafer (hereinafter referred to as "wafer").

BACKGROUND ART

A conventional inspecting apparatus 100, e.g., probe apparatus, is shown in, for example, FIGS. 10 and 11. The inspecting apparatus 100 comprises a loader chamber 1 for pre-aligning wafers W during transfer of the wafers W and a prober chamber 2 receiving the wafers W from the loader chamber 1 for inspecting electrical characteristics of the wafers W. A tweezers 3 and a sub-chuck 4 are arranged in the loader chamber 1. While the wafer W is being transferred by the tweezers 3, the wafer W is pre-aligned in the sub-chuck 4 on the basis of the orientation flat of the wafer W. Also, a main chuck 5 and an alignment mechanism 6 are arranged within the prober chamber 2. The main chuck 5 having the wafer W mounted thereon is moved in X, Y and θ directions so as to align the wafer W with a probe 7A of a probe card 7 positioned above the main chuck 5 in co-operation with the alignment mechanism 6. The main chuck 5 is moved upward in the Z-direction so as to bring the probe 7A into an electrical contact with an electrode of an integrated circuit formed on the wafer W. As a result, the electrical characteristics of the integrated circuit formed on the wafer W are inspected via a test head T.

The probe card 7 is detachably mounted to a performance board mounted to a head plate 8 of the prober chamber 2. The probe card 7 includes a plurality of probes 7A each consisting of, for example, a tungsten wire, a frame-like supporting section (not shown) for supporting the probe 7A, and a printed circuit board having a printed circuit fixed to the supporting section and connected to the probe 7A. The probe card 7 is replaced for use depending on the kind of the wafer W.

DISCLOSURE OF INVENTION

The conventional probe card 7 includes a board having a large area such as a printed circuit board in addition to the probe 7A, which is a contactor, and thus, is large. The probe card 7 is made larger and larger and heavier and heavier with progress in the degree of integration of the device and with increase in the number of probe needles. Therefore, it will become more and more difficult to automatically renew the probe card depending on the kind of the wafer.

The accuracy of inspection tends to be lowered by the difference in physical properties between the probe 7A and the wiring of the printed circuit board and by the influences given by the length of the wiring. Recently, a bump type contactor is under development in an attempt to cope with the decrease in the arranging pitch of electrode pads of the integrated circuit. However, the technology relating to the handling of the contactor, e.g., how to renew the contactor, has not yet been developed and provides a problem to be solved in the future.

The present invention has been achieved for overcoming the problem described above.

An object of the present invention is to provide a holding mechanism of a contactor that permits detachably holding a contactor itself having a large number of bump type probes formed therein and also permits enhancing the inspection accuracy.

Another object of the present invention is to provide an automatic renewing mechanism of a contactor that permits automatically renewing a contactor relative to a holding mechanism of the contactor so as to increase the through-put of the inspection.

According to a first aspect of the present invention, there is provided a holding mechanism of a contactor in an inspection apparatus, comprising a contactor, a frame fixed to a board, a plurality of latch mechanisms arranged within the frame for holding the contactor, and a suction fixing mechanism for fixing the contactor held by the latch mechanisms within the frame by utilizing a vacuum suction force.

In the contactor holding mechanism of the present invention, it is desirable for the board to be a performance board of the inspection apparatus.

In the contactor holding mechanism of the present invention, it is desirable for the frame to be a ring-like frame.

In the contactor holding mechanism of the present invention, it is desirable for the latch mechanism to have a latch ball and an elastic member elastically supporting the latch ball and for the contactor to have a plurality of concave portions for engagement with the latch ball.

In the contactor holding mechanism of the present invention, it is desirable for the latch mechanism to have a latch member that can be projected and retreated and a latch operating mechanism that permits the latch member to be projected and retreated, and for the contactor to have a plurality of engaging portions for engagement with the latch member.

In the contactor holding mechanism of the present invention, it is desirable for the contactor to have a plurality of hook-like projections formed on the circumferential surface and for the latch mechanism to have a latch member engaged with the hook-like projections of the contactor and a latch operating section for releasing the engagement of the latch member.

In the contactor holding mechanism of the present invention, it is desirable for the latch mechanism to have a latch member for supporting the contactor in the lower surface and a latch operating section for retreating the latch member from the lower surface of the contactor so as to release the support of the contactor.

Further, it is desirable for the contactor holding mechanism of the present invention to further comprise an interface board arranged within the frame for achieving an electrical connection between the performance board and the contactor.

According to a second aspect of the present invention, there is provided an automatic renewing apparatus of a contactor in an inspection apparatus, comprising:

a holding mechanism for detachably holding a contactor; and a delivery mechanism for delivering the contactor to and from the holding mechanism, the delivery mechanism having at least one arm that is movably arranged and at least one holding section formed in the arm for detachably holding the contactor.

It is desirable for the holding mechanism of the contactor included in the automatic renewing mechanism to be a holding mechanism of the contactor according to the first aspect of the present invention.

In the contactor holding mechanism included in the automatic renewing mechanism of the present invention, it is desirable for the arm of the delivery mechanism to be arranged swingable and movable in the vertical direction.

In the contactor holding mechanism included in the automatic renewing mechanism of the present invention, it is desirable for the holding section of the delivery mechanism to be capable of detachably holding the contactor by a vacuum suction force.

In the contactor holding mechanism included in the automatic renewing mechanism of the present invention, it is desirable for a plurality of holding sections of the delivery mechanism to be arranged in an arcuate configuration in the swinging direction.

According to a third aspect of the present invention, there is provided a holding mechanism of a contactor in an inspection apparatus, comprising a contactor, means for holding the contactor having a frame fixed to a performance board, a plurality of latch means for holding the contactor inside the frame, and suction fixing means for fixing the contactor held by the latch means inside the frame by utilizing a vacuum suction force.

According to a fourth aspect of the present invention, there is provided an automatic renewing mechanism of a contactor, comprising:

a holding mechanism of a contactor including a ring-like frame fixed to a performance board, a latch mechanism for holding the contactor inside the frame, a suction fixing mechanism for fixing the contactor held by the latch mechanism inside the frame by utilizing a vacuum suction force, and an interface board arranged within the frame for achieving an electrical connection between the performance board and the contactor; and an automatic renewing mechanism of the contactor including an arm arranged swingable and movable in the vertical direction for delivering the contactor to and from the holding mechanism, and a delivery mechanism having at least one holding section for detachably holding the contactor by utilizing a vacuum suction force.

BRIEF DESCRIPTION OF DRAWINGS

The accompanying drawings cooperate with and constitute a part of the specification and exemplify suitable embodiments of the present invention. Also, these drawings, the general description given above, and the following detailed description relating to preferred embodiments of the present invention will collectively set forth clearly the technical idea of the present invention.

FIGS. 7A and 7B show a holding mechanism according to another embodiment of the present invention, wherein FIG. 7A is a cross sectional view showing a gist portion of the state that a contactor is held by a holding mechanism, and FIG. 7B is a plan view seen from below and schematically showing the state that a contactor is held by the holding mechanism shown in FIG. 7A;

FIGS. 8A and 8B show the operation in a gist portion of the holding mechanism according to another embodiment of the present invention, wherein FIG. 8A is a side view, partly broken away, showing the state immediately before the contactor is held by the holding mechanism, and FIG. 8B is a plan view as seen in the direction denoted by an arrow B in FIG. 8A;

FIGS. 9A, 9B and 9C show the operation in a gist portion of the holding mechanism according to another embodiment of the present invention, wherein FIG. 9A is a side view, partly broken away, showing the state immediately before the contactor is held by the holding mechanism, FIG. 9B is a cross sectional view as seen in the direction denoted by an arrow B in FIG. 9A, and FIG. 9C shows the state that the contactor is detached from the holding mechanism;

BEST MODE FOR CARRYING OUT THE INVENTION

Figure 1:
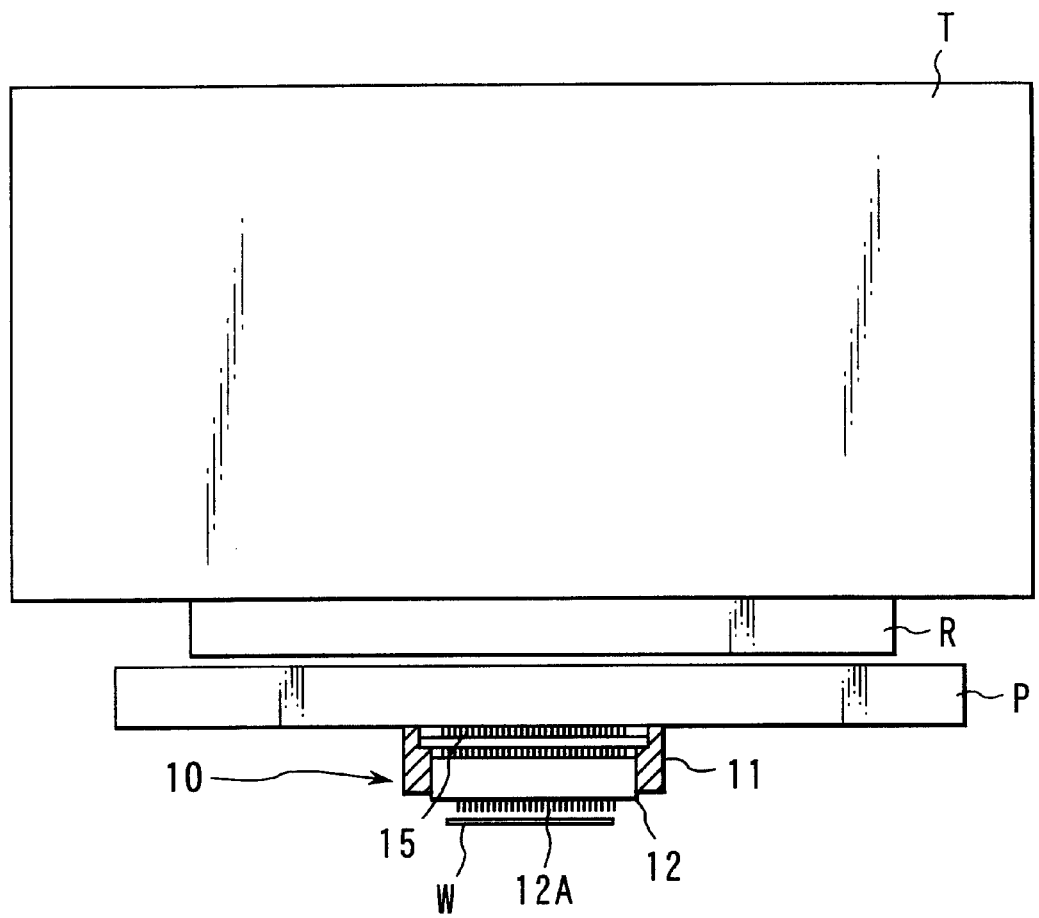
FIG. 1 is a side view showing a gist portion of the holding mechanism according to an embodiment of the present invention.

The present invention will now be described based on the embodiments shown in FIGS. 1 to 9. The gist portions alone of the present invention are shown in the drawings for the sake of convenience for describing the technical idea of the present invention while omitting the description of the body of the inspecting apparatus.

Figure 2:
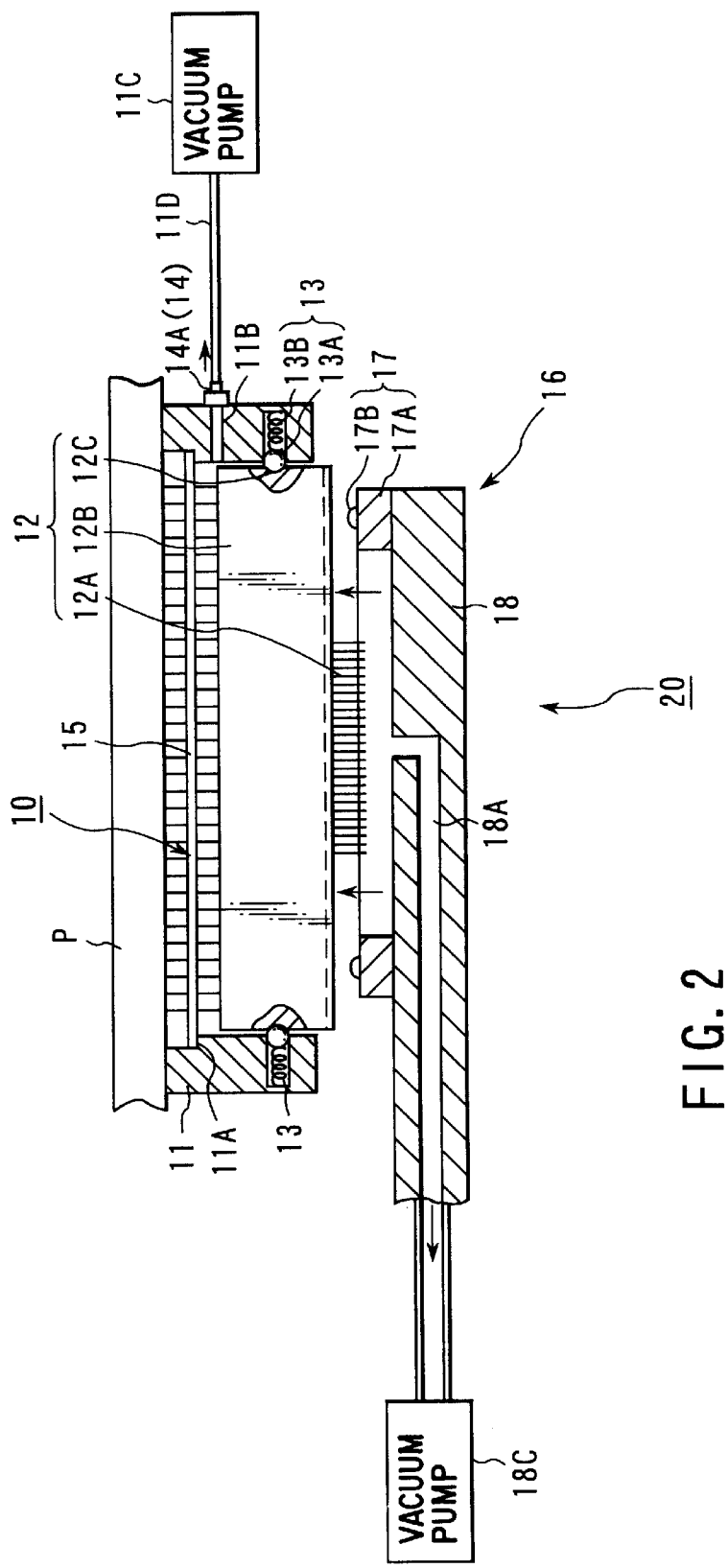
FIG. 2 is a cross sectional view showing in a magnified fashion the holding mechanism shown in FIG. 1 and a delivery mechanism.

FIGS. 1 and 2 exemplify a holding mechanism 10 of a contactor 12 according to one embodiment of the present invention. A frame 11 housing and holding the contactor 12 is fixed to a board P, e.g., a performance board of a probe apparatus. It is desirable for the frame 11 to be shaped ring-like to conform with the outer contour of the contactor 12. A plurality of latch mechanisms 13 are mounted along the inner circumferential surface of the frame 11. The latch mechanism 13 serves to hold the contactor 12 housed inside the frame 11. The contactor 12 held by the latch mechanism 13 is fixed within the frame 11 by a vacuum suction force produced by a suction fixing mechanism 14. An interface board 15 serves to bring a plurality of electrodes (not shown) of the contactor 12 fixed by the suction fixing mechanism 14 into an electrical contact with the performance board P. A probe 12A of the contactor 12 is in an electrical contact with an electrode pad (not shown) of a device formed on a wafer W. The device formed on the wafer W is electrically connected to a test head T via the interface board 15, the performance board P and a probe ring R so as to inspect the electrical characteristics of the device. As shown in FIG. 2, the peripheral portion of the interface board 15 can be supported by a stepped portion 11A formed in the inner circumferential surface of the frame 11.

The contactor 12 comprises a plurality of probes 12A, a main body 12B made of a ceramic material such as aluminum nitride and sized scores of millimeters square, and a plurality of terminal electrodes (not shown) connected to the probes 12A on the upper surface of the main body 12B, as shown in FIG. 2. The probes 12A can be arranged to form a matrix on the main body 12B and can be formed by, for example, a CVD method in the shape of bumps conforming with the electrode pads of the device formed on the wafer W. The probes 12A are capable of coping with the decrease in the pitch of the electrode pads that is expected in the future. A plurality of concavities 12C conforming with the latch mechanism 13 are formed in the circumferential periphery of the main body 12B.

As shown in FIG. 2, the latch mechanism 13 can be equidistantly mounted along the inner circumferential surface of the frame 11. It is possible for the latch mechanism 13 to comprise a plurality of latch balls 13A elastically engaged with the plural concavities 12C formed along the circumferential surface of the contactor 12 and a plurality of springs 13B elastically supporting these latch balls 13A. It is not absolutely necessary for the latch ball 13A to be a ball. It suffices for the latch ball 13A to have a projection engaged with the concavity 12C. At the time when the contactor 12 is inserted into the frame 11 and the concavity 12C of the contactor 12 reaches the position of the latch ball 13A, the latch ball 13A is elastically engaged with the concavity 12C and the terminal electrode of the contactor 12 is pressed against the interface board 15 so as to achieve an electrical connection to the test head T.

It is possible for the suction fixing mechanism 14 to comprise a through-hole 11B extending through the circumferential surface of the frame 11 and a vacuum pump 11C connected to the through-hole 11B via a connection tool 14A. The vacuum suction force generated by exhausting the air within the frame 11 having the contactor 12 mounted thereto by the vacuum pump co-operates with the latch mechanism 13 so as to hold the contactor 12 within the frame 11 without fail. When the contactor 12 is detached from the frame 11, a vacuum exhaust line 11D is switched from the vacuum pump to the air atmosphere so as to bring the space between the frame 11 and the contactor 12 back to the atmospheric pressure. Even under the state that the pressure within the frame 11 is brought back to the atmospheric pressure, the contactor 12 is held by the latch mechanism 13 and, thus, the contactor 12 is prevented from dropping down.

Figure 3A:
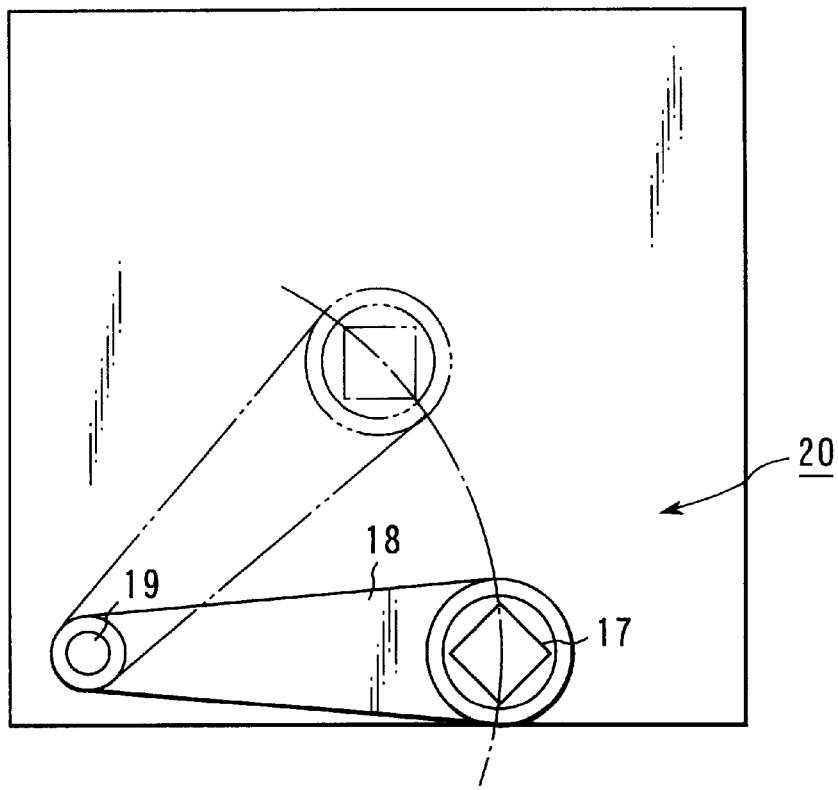
FIG. 3A is a plan view for explaining the operation of the delivery mechanism in an automatic renewing mechanism.
Figure 3B:
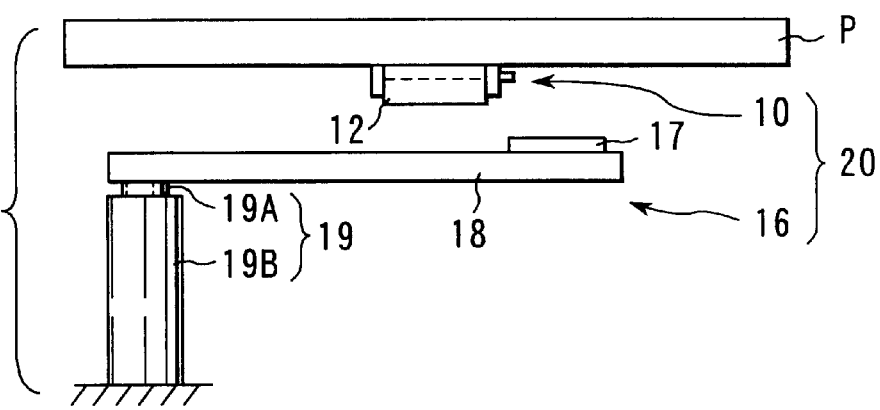
FIG. 3B is a side view showing the automatic renewing mechanism shown in FIG. 3A.

It is possible for an automatic renewing mechanism 20 of the contactor in this embodiment to comprise the holding mechanism 10 and the delivery mechanism 16, as shown in FIGS. 2, 3A and 3B. The contactor 12 is transferred by the delivery mechanism 16 to the holding mechanism 10 so as to be automatically renewed in the holding mechanism 10. Since the holding mechanism 10 has already been described, the delivery mechanism 16 alone will now be described. The delivery mechanism 16 comprises a movable arm 18 and a holding section 17 mounted to the arm 18 for holding the contactor 12. The arm 18 is swingable and movable in a vertical direction. Specifically, the arm 18 is swung and moved vertically by an arm driving section 19, as shown in FIG. 13B.

The suction holding section 17 can be formed of a frame-like projection 17A and a sealing member 17B positioned on the upper surface of the frame-like projection 17A. The probe 12A of the contactor 12 is positioned within the space of the frame-like projection 17A so as not to be bruised. The arm 18 includes an exhaust passageway 18A open in the center inside the frame-like projection 17A. The exhaust passageway 18A is connected to the vacuum pump 18C. When the contactor 12 is delivered to the holding mechanism 10, the pressure within the exhaust passageway 18A is switched to the atmospheric pressure, with the result that the pressure within the space between the frame-like projection 17A and the contactor 12 is brought back to the atmospheric pressure so as to break off the vacuum suction force. The contactor 12 is held stationary on the frame-like projection 17A by driving the vacuum pump with the contactor 12 disposed on the suction holding section 17. Also, the contactor 12 is made detachable from the frame-like projection 17A by releasing the vacuum exhaust line to the air atmosphere.

It is possible for the arm driving section 19 to comprise a driving rod 19A joined to the proximal end of the arm 18 and a driving source 19B causing the driving rod 19A to be swung and moved in a vertical direction. The arm driving section 19 can be arranged in a corner portion within an inspection apparatus body. When the contactor 12 is renewed, the suction holding section 17 formed at the distal end portion of the arm 18 is swung to be positioned right under the holding mechanism 10 under the control by a control mechanism (not shown). In this position, the arm 18 is moved in a vertical direction so as to deliver the contactor 12 to the holding mechanism 10.

The operation of the apparatus described above will now be described. Where the contactor 12 is mounted to an inspection apparatus, the contactor 12 is disposed on the suction holding section 17 of the automatic renewing mechanism 20. Under the control by a control apparatus, the vacuum pump of the delivery mechanism 16 is driven so as to exhaust the air in the space between the contactor 12 and the frame-like projection 17A, thereby forming a vacuum suction force. The contactor 12 is held within the frame-like projection 17A by the vacuum suction force. In this case, the contactor 12 is pressed against the sealing member 17B, and a reduced pressure is maintained in the space within the frame-like projection 17A, with the result that the contactor 12 is fixed on the suction holding section 17 without fail.

As shown in FIG. 3A, the driving rod 19A and the arm 18 are swung in the counterclockwise direction by the arm driving section 19 under control by the control apparatus. The holding section 17 is swung from the front side denoted by a solid line to a position right under the holding mechanism 10, which is denoted by a broken line. Then, the arm 18 is moved upward so as to allow the contactor 12 to be inserted into the holder 11 and held by the latch mechanism 13. Under this condition, the movement of the driving rod 19A is stopped.

Figure 10:
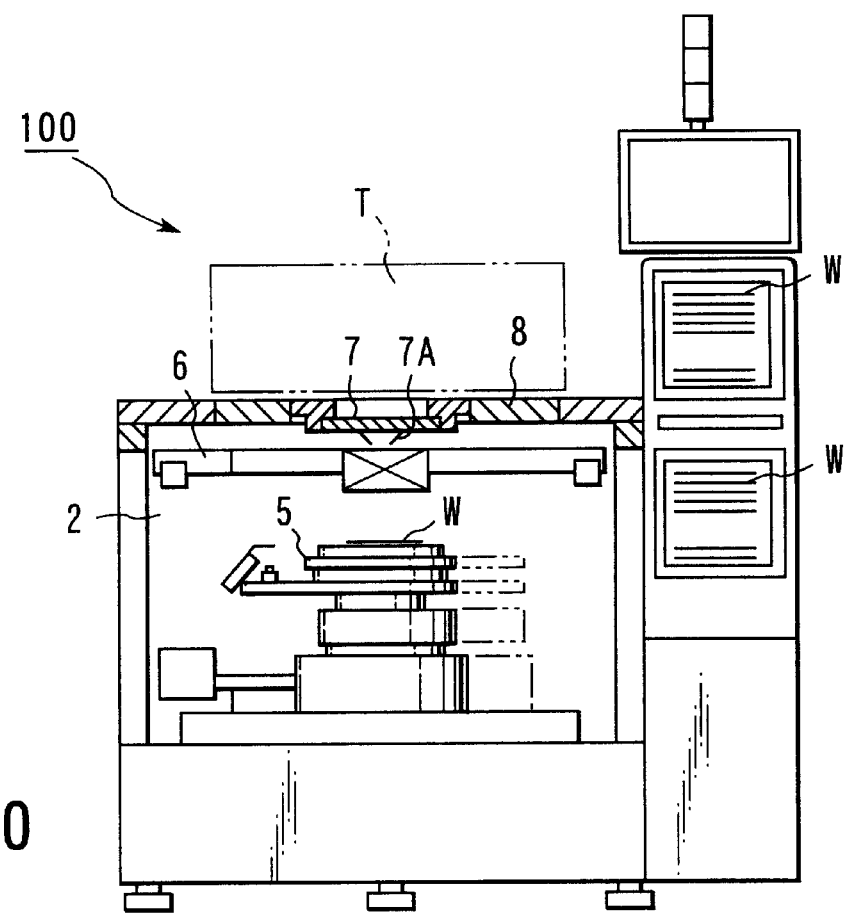
FIG. 10 is a partial cross sectional view exemplifying a conventional inspecting apparatus.
Figure 11:
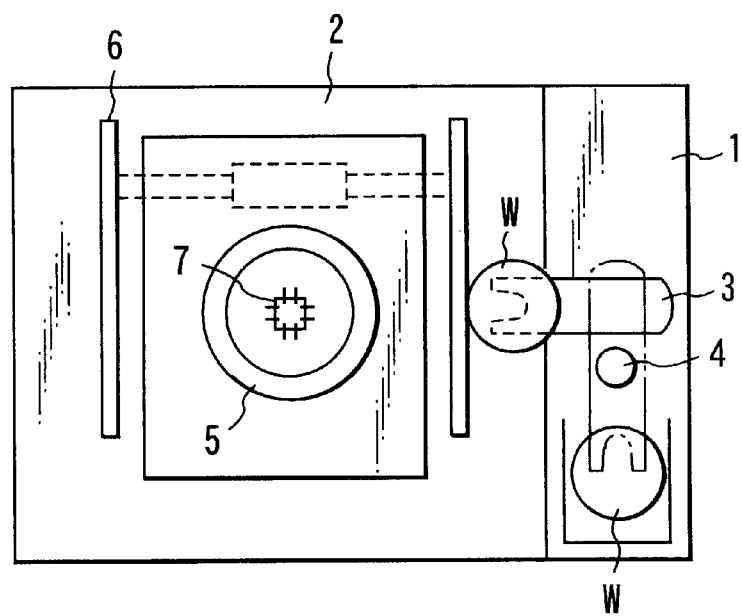
FIG. 11 is a plan view showing the inner structure of the conventional inspecting apparatus shown in FIG. 10.

The operation of the vacuum pump 18C is stopped under control by the control apparatus so as to release the air in the space between the contactor 12 and the frame-like projection 17A to the air atmosphere so as to make the contactor 12 detachable from the holding section 17. On the other hand, the vacuum pump of the holding mechanism 10 is operated so as to exhaust the air within the frame 11 so as to lower the pressure within the frame 11. As a result, the contactor 12 is fixed by suction within the frame 11. The arm 18 of the delivery mechanism 16 is moved downward away from the holding mechanism 10 so as to be brought back to the initial position. The electrical characteristics of the wafer W are inspected in an inspecting apparatus 100 (FIG. 10). During the inspection, it is desirable to continue to drive the vacuum pump of the holding mechanism 10 so as to fix the contactor 12 without fail.

Where different kinds of wafers are inspected, the used contactor 12 is replaced by the next contactor 12. The delivery mechanism 16 operates as described above so as to move the holding section 17 from the front side of the inspecting apparatus to a position right under the holding mechanism 10. Then, the arm 18 is moved upward, and the vacuum pump is driven with the contactor 12 kept in contact with the holding section 17. As a result, the contactor 12 is held by vacuum suction on the holding section 17. If the space within the frame 11 is allowed to communicate with the air atmosphere, the contactor 12 is held solely by the latch mechanism 13. The contactor 12 is held on the suction holding section 17 by the delivery mechanism 16. Then, the arm 18 is moved downward so as to be detached from the holding mechanism 10. The arm 18 is swung in the clockwise direction by the arm driving section 19 so as to be brought back to initial position. Then, the next contactor 12 is mounted to the suction holding section 17 of the delivery mechanism 16. The delivery mechanism 16 delivers the contactor 12 to the holding mechanism 10 so as to finish the automatic renewal, and the arm 18 is brought back to the initial position.

As described above, the holding mechanism 10 in this embodiment comprises the frame 11 mounted to the performance board P, the latch mechanism 13 mounted to the inner circumferential surface of the frame 11, and the suction fixing mechanism 14 for holding by vacuum suction force the contactor 12 held by the latch mechanism 13. As a result, the bump-type contactor 12, which is expected to become a main type in the future, can be detachably held, and the automatic renewal of the contactor 12 can be realized. It should be noted that the wiring length in the present invention between the contactor 12 and the test head T is markedly shorter than that in the prior art, making it possible to suppress the influences given by the wiring length between the contactor 12 and the test head T so as to improve the accuracy of the inspection.

In this embodiment, the latch mechanism 13 can be equidistantly mounted to the inner circumferential surface of the holder 11. The latch mechanism 13 simply comprises the latch ball 13A that is elastically engaged with a plurality of concavities 12C formed along the circumferential surface of the contactor 12 and the spring 13B elastically supporting the latch ball 13A. The latch mechanism 13 of the simple construction permits detachably holding the contactor 12 within the frame 11, making it possible to prevent the contactor 12 from dropping down without fail.

In this embodiment, the interface board 15 serving to join the performance board P and the contactor 12 is arranged within the holder 11 to permit the contactor 12 to be connected to the performance board P without fail and to permit the test head T to be connected to the wafer W without fail.

The automatic renewing mechanism 20 in this embodiment comprises the suction holding section 17 for holding the contact 12 by suction and the delivery section 16, making it possible to automatically renew easily the contactor 12 of the holding mechanism 10 so as to increase the through-put of the inspection.

Figure 4:
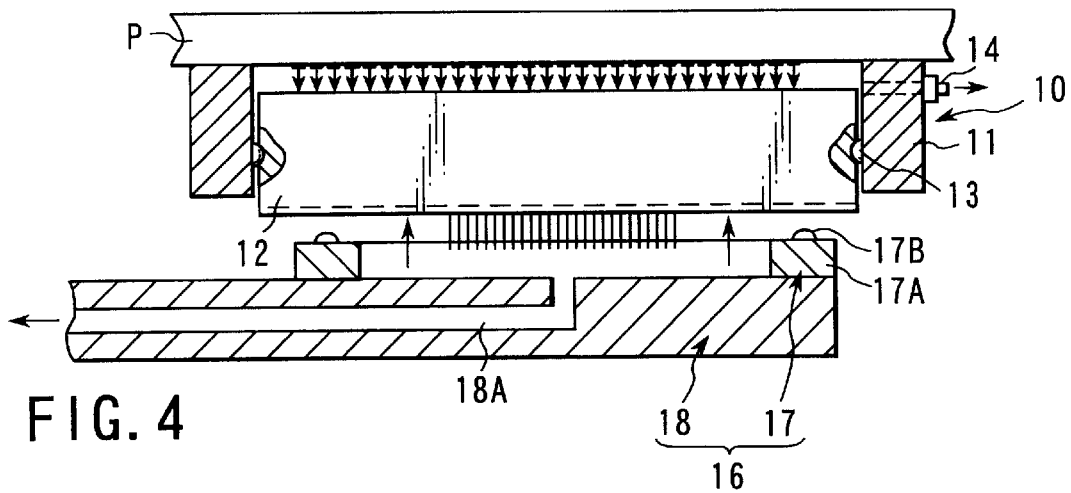
FIG. 4 is a cross sectional view showing an automatic renewing mechanism according to another embodiment of the present invention.
Figure 5:
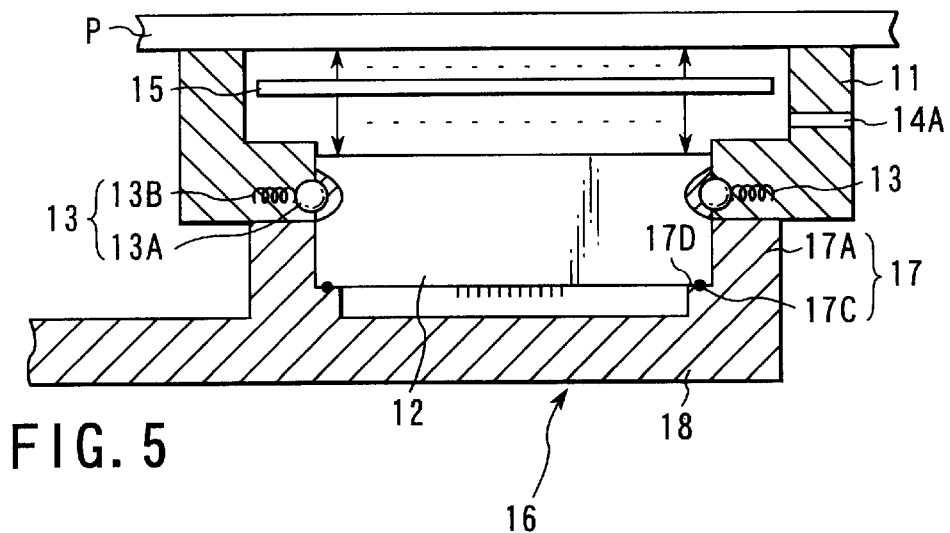
FIG. 5 is a cross sectional view showing an automatic renewing mechanism according to another embodiment of the present invention.

FIGS. 4 and 5 show another embodiment of the present invention. The interface board 15 shown in FIGS. 1 and 2 is omitted in the holding mechanism and automatic renewing mechanism shown in FIG. 4. On the other hand, the holding mechanism and automatic renewing mechanism shown in FIG. 5 are substantially equal in construction to the embodiment shown in FIGS. 1 to 3, except that the embodiment shown in FIG. 5 differs from the embodiment shown in FIGS. 1 to 3 in the construction of the delivery mechanism 16. A stepped portion 17D is formed on the inner circumferential surface of the frame-like projection 17A of the suction holding section 17 shown in FIG. 5. The opening of the frame-like projection 17A is sized to be capable of receiving the contactor 12, and the contactor 12 is supported by a stepped portion 17D. It is desirable for a sealing member 17C to be arranged in the stepped portion 17D. The hermetic state is maintained by the sealing member 17C when the contactor 12 is subjected to a vacuum suction. In these two embodiments, the function and effect similar to those produced by the embodiment shown in FIGS. 1 to 3 can also be produced.

Figure 6:
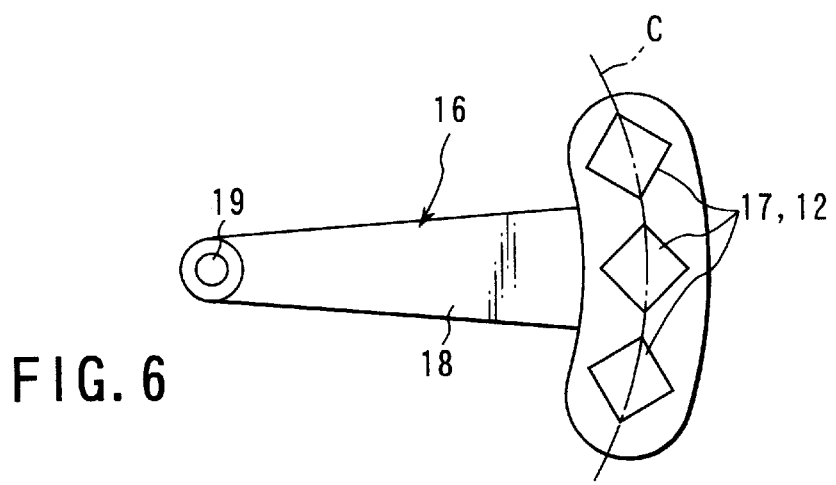
FIG. 6 is a plan view showing a delivery mechanism of the automatic renewing mechanism according to another embodiment of the present invention.

FIG. 6 shows the delivery mechanism 16 simultaneously holding a plurality of contactors 12, e.g., three contactors. For example, three suction holding sections 17 are formed along the arc of an arcuate plate in the delivery mechanism 16, as shown in FIG. 6. The central line C passing through the center in the width direction of the arcuate plate coincides with the locus along which the center of the contactor 12 is swung. The three suction holding sections 17 are arranged on the central line C. It is desirable for these suction holding sections 17 to be arranged equidistantly. As a result, the each contactor 12 is positioned right under the holding mechanism by the swinging of the arm 18 so as to face in a predetermined direction as denoted by the broken line in FIG. 3A. Where a plurality of suction holding sections 17 are arranged, a plurality of contactors 12 can be collectively held by a single delivery mechanism 16 so as to renew consecutively and automatically the plural contactors 12 without relying on the manual operation. As a result, the through-put of the inspection can be further improved. Incidentally, the construction of the suction holding section 17 itself is substantially equal to that shown in FIGS. 1 to 5.

Figure 7A:
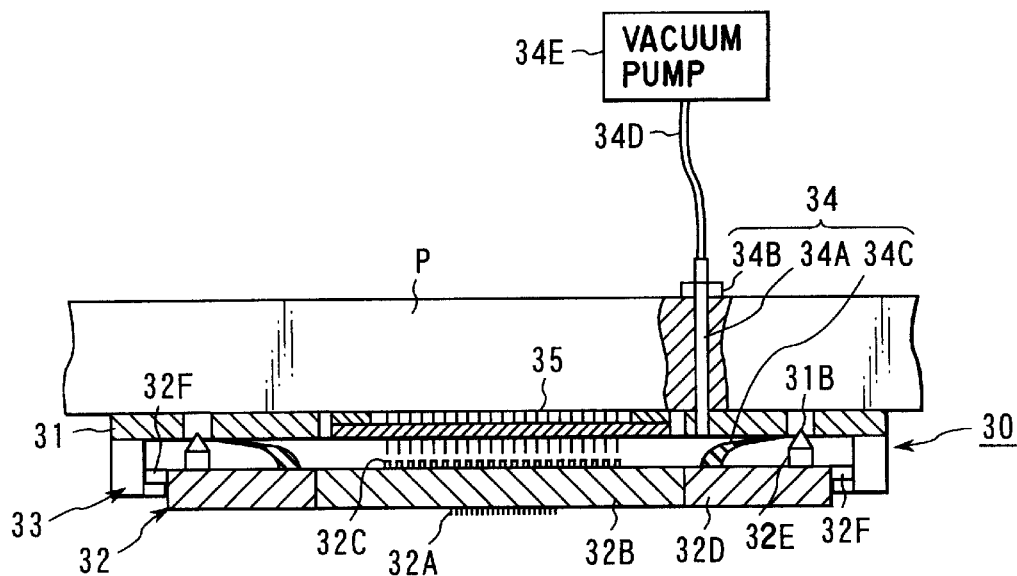
Figure 7B:
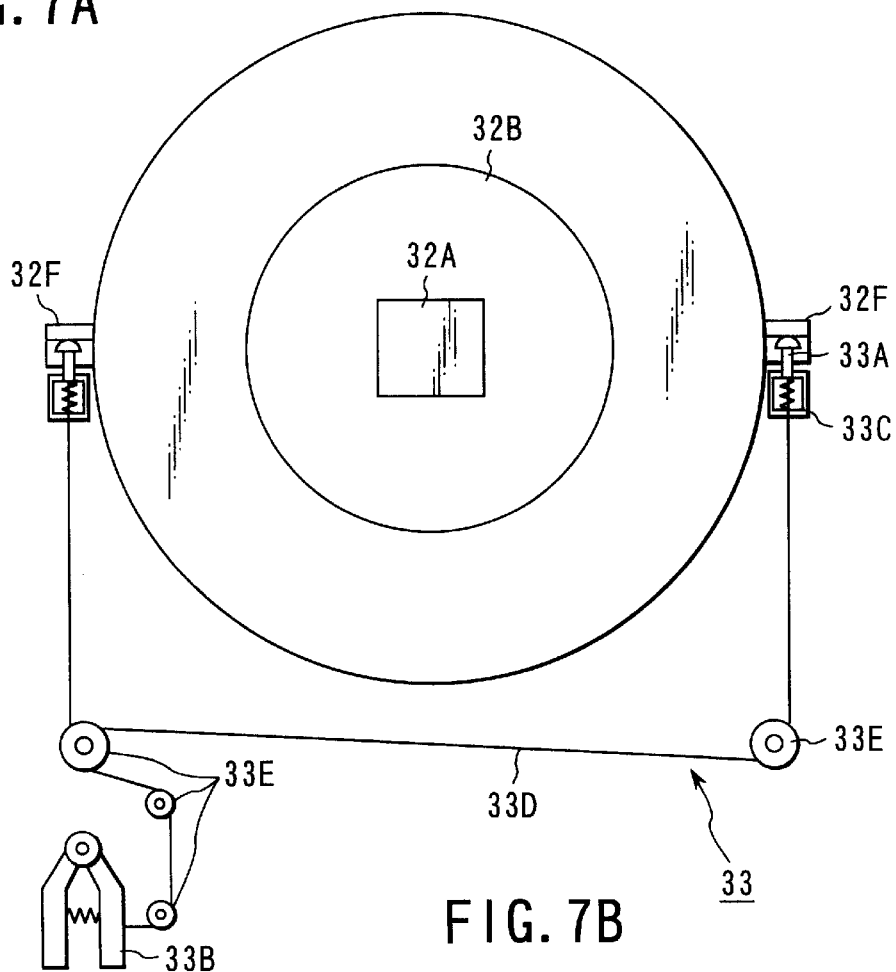

FIGS. 7A and 7B shows a holding mechanism 30 of the contactor according to another embodiment of the present invention. As shown in FIGS. 7A and 7B, the holding mechanism 30 in this embodiment comprises a holding body 31 fixed to the performance board P of the probe apparatus, a latch mechanism 33 mounted to the holding body 31 to hold the contactor 32 from the peripheral portion thereof, a suction holding mechanism 34 for fixing the contactor 32 held by the latch mechanism 33 by the vacuum suction force, and an interface board 35 for relaying the connection between the contactor 32 fixed by the suction holding mechanism 34 and the performance board P. The contactor 32 is electrically connected to the performance board P via the interface board 35. Any of the performance board P and the interface board 35 in this embodiment and in the embodiment that is to be described herein later can be constructed substantially equal to the construction in this embodiment described above.

It is possible for the holding body 31 to be a ring-like plate having a large opening in the center, as shown in FIG. 7A. The interface board 35 can be arranged within the opening noted above. A latch mechanism 33 that is to be described herein later is mounted to the holding body 31. As shown in FIG. 7A, the contactor 32 comprises a plurality of probes 32A, a contactor body 32B on which the probes 32A are formed in the form of a matrix, and a terminal electrode 32C formed on the upper surface of the contactor body 32B. It is possible for the probes 32A to be of a bump structure formed by, for example, a CVD method and arranged to conform with the arrangement of the electrode pads of the device formed on the semi-conductor wafer W. The particular construction is capable of coping with the electrode pads of the device, though the arranging pitch of the electrode pads is expected to become narrower in the future. The contactor body 32B can be formed integral with a frame 32D. A plurality of positioning projections 32E inserted into positioning holes 31B of the holding body 31 for mounting the contactor 32 to the holding body 31 are formed in the outer circumferential edge portion on the upper surface of the frame 32D. These positioning projections 32E are equidistantly arranged in the circumferential direction.

The latch mechanism 33 is used for temporarily holding the contactor 32 within the holding body 31. As shown in FIGS. 7A and 7B, the latch mechanism 33 comprises a plurality of latch members 33A engaged with a plurality of projections 32F formed along the circumferential surface of the contactor 32 and a latch operating member 33B that permits these latch members 33A to retreat from the projections 32F. The contactor is held by the engagement of these projections 32F with the latch members 33A, and the engagement is released by allowing the latch members 33A to retreat from the projections 32F. As shown in FIG. 7B, the latch member 33A is mounted to a cylinder 33C housing a spring coil. The latch member 33A is kept urged by the spring outward of the cylinder 33C. The latch member 33A and the latch operating member 33B are joined to each other by, for example, a wire 33D. When the contactor 32 is mounted to the holding body 31, the latch operating member 33B is operated to permit the latch member 33A to project from the cylinder 33C. When the contactor 32 is detached from the holding body 31, the latch operating member 33B is operated to permit the latch member 33A to retreat into the cylinder 33C. The latch operating member 33B shown in the drawing is operated manually. It is possible to make the latch operating member 33B operable automatically. A reference numeral 33E represents a guide roller for guiding the wire 33D.

The suction fixing mechanism 34 comprises a vacuum pump 34E connected via a connection tool 34B to a through-hole 34A extending through the holding body 31 and the performance board P and a sealing member 34C having a tongue-shaped cross section, which is mounted to the upper surface of the frame 32D of the contactor 32. The suction fixing mechanism 34 is capable of starting its operation at the time when the latch mechanism 33 permits the contactor 32 to be held by the holding body 31 and the sealing member 34C is brought into contact with the holding member 31. It is possible for the vacuum exhaust line 34D of the suction fixing mechanism 34 to be constructed such that the connection to the vacuum pump 34E is switched to the connection to the air atmosphere. When the contactor 32 is detached, the vacuum exhaust line 34 is switched so as to be connected to the air atmosphere.

It follows that, when the contactor 32 is renewed in the holding mechanism 30 in this embodiment, it is possible to employ an automatic renewing mechanism substantially equal in construction to the automatic renewing mechanism shown in FIGS. 3 to 6. The contactor 32 is transferred by the automatic renewing mechanism to a position right under the holding mechanism 30. The contactor 32 is moved upward to reach the holding body 31. The latch mechanism 33 is operated when the sealing member 34C is brought into contact with the holding body 31. The wire 33D is operated to allow the latch member 33A to project from within the cylinder 33C so as to be engaged with the projection 32F, with the result that the contactor 32 is prevented from falling down. The suction fixing mechanism 34 is operated to allow the contactor 32 to be strongly sucked toward the holding body 31 so as to ensure an electrical connection between the terminal electrode of the contactor and the interface board 35, thereby making the apparatus ready for inspection. When the contactor 32 is renewed after completion of the inspection, the contactor 32 is renewed by the opposite operation. The function and effect similar to those produced in each of the embodiments described previously can also be produced in this embodiment.

Figure 8A:
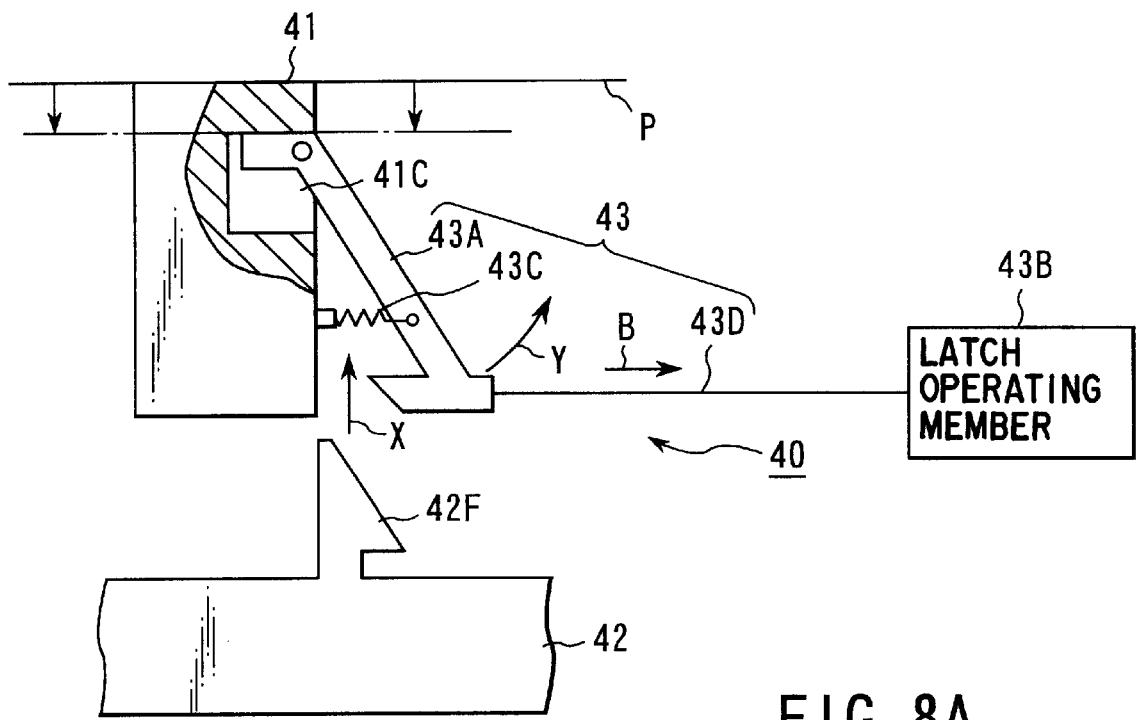

FIG. 8 shows another embodiment of the present invention. The holding mechanism in this embodiment differs from the mechanism shown in FIG. 7 in the latch mechanism. A latch mechanism 43 in a holding mechanism 40 in this embodiment comprises a latch member 43A mounted to a frame (holding body) 41 and a latch operating member 43B, as shown in FIG. 8A. The latch member 43A is engaged with a plurality of hook-like projections 42F formed on the circumferential surface of the contactor 42. The latch operating member 43B permits the latch member 43A to retreat from the hook-like projection 42F so as to release the contactor 42.

Figure 8B:
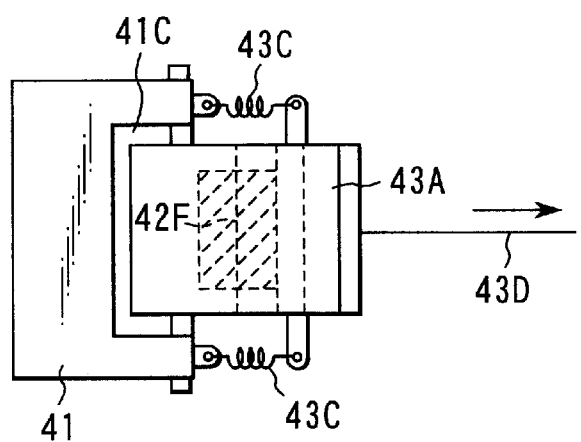

It is possible for the latch member 43A to be a wide plate-like member having a hook at the tip as shown in FIG. 8B. The proximal end of the plate-like member is engaged by a pin with a recess 41C formed in the holding body 41. The both sides in the vicinity of the lower end of the latch member 43A are connected to the holding body 41 by springs 43C such that the hook portion of the latch member 43A is elastically urged by the springs 43C toward the holding body 41, as shown in FIGS. 8A and 8B. The distal end of the latch member 43A is joined to the latch operating member 43B via a wire 43D. The latch operating member 43B is operated to permit the distal end of the latch member 43A to be moved away from the holding body 41 against the spring force of the springs 43C. The hook-like distal end of the latch member 43A is tapered so as to facilitate the engagement of the hook-like projection 42F of the contactor 42 with the latch member 43A.

In this embodiment, the contactor 42 is moved upward by the automatic renewing mechanism to reach the holding body, as denoted by an arrow X in FIG. 8A. The hook-like projection 42F of the contactor 42 is moved upward through a concavity formed by the tapered surface at the distal end of the latch member 43A and the holding body 41. The latch member 43A is pushed in a direction denoted by an arrow Y shown in FIG. 8A against the spring force of the springs 43C. When the latch member 43A is moved beyond the hook-like projection 42F and the hook portion of the latch member 43A, the springs 43C allow the projection 42F and the latch member 43A to be engaged with each other, with the result that the contactor 42 is prevented from falling down. The suction fixing mechanism shown in FIG. 7A is operated to permit the contactor 42 to be fixed to the holding body 41 so as to be made ready for inspection. When the contactor 42 is detached from the holding body 41, the latch operating member is manually operated so as to permit the distal end portion of the latch member 43A to be detached from the holding body 41 via the wire 43D. After the hook-like projection 42F is released from the hook portion of the latch member 43A, the contactor 42 is detached from the holding body 41 by the automatic renewing mechanism.

Figure 9A:
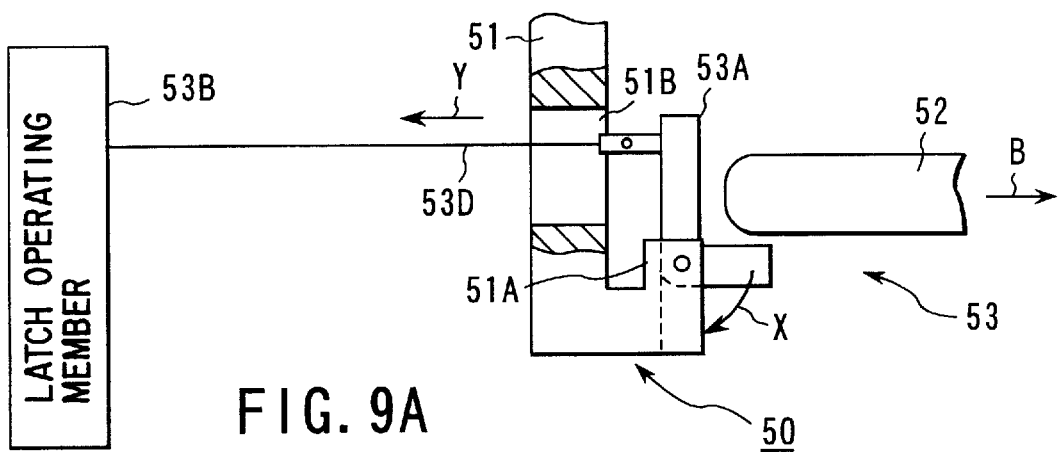
Figure 9B:
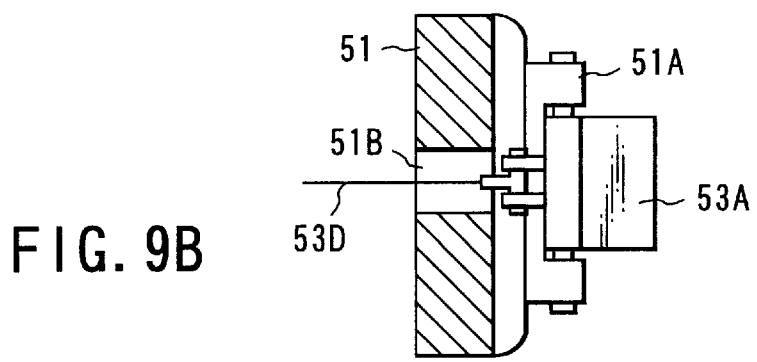

FIG. 9 shows still another latch mechanism. The latch mechanism included in the holding mechanism 50 in this embodiment comprises a latch member 53A shaped L in the side view and serving to support the contactor 52 from the lower surface thereof and a latch operating member 53B, as shown in FIGS. 9A and 9B. The latch operating member 53B allows the latch member 53A to retreat from the lower surface of the contactor 52 so as to release the contactor 52. It is possible for the latch member 53A to be a wide plate-like member that is shaped L in the side view as shown in FIGS. 9A and 9B. The frame (holding body) 51 includes a supporting section 51A projecting toward.the contactor 52.

Figure 9C:
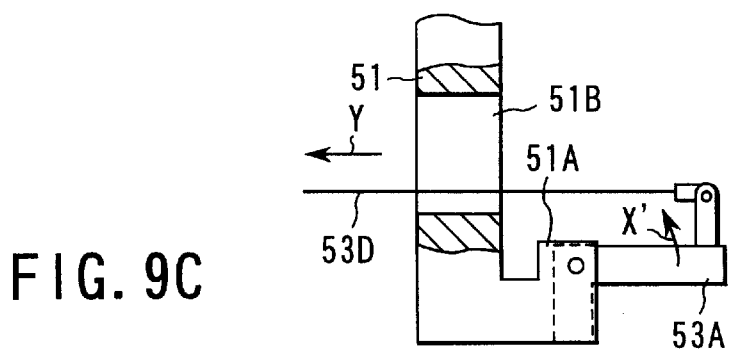

The L-shaped corner of the latch member 53A is engaged by a pin with the supporting section 51A. A spring member (not shown) is mounted to the pin coupling section. The latch member 53A is kept urged in the direction denoted by an arrow X by the spring member. The latch operating section is joined to one end of the latch member 53A by the wire 53D. The wire 53D is pulled by the latch operating section in a direction denoted by an arrow Y. The latch member 53A is pulled up against the spring force of the spring in a direction denoted by an arrow X' and supports the contactor 52 in the state that the other end of the latch member 53A is made horizontal. In FIGS. 9A, 9B and 9C, a reference numeral 51B denotes a hole made in the holding body 51 for passing the wire 53D.

In this embodiment, the contactor 52 is moved upward to reach the holding body 51 by the automatic renewing mechanism. Also, the latch member 53A is pulled up by the latch operating section. Further, the outer circumferential edge portion of the contactor 52 is supported by the latch member 53A. As a result, the contactor 52 is prevented from falling down. The contactor 52 is fixed to the holding body 51 so as to be made ready for inspection. Where the contactor 52 is renewed, the wire 53D is loosened by the latch operating section. The latch member 53A is swung in the direction denoted by an arrow X in FIG. 9A so as to be detached from the contactor 52 and finally put in the state shown in FIG. 9C.

The present invention is not limited at all to each of the embodiments described above. The design of each constituent of the present invention can be changed appropriately, as desired.

The present invention as defined in claims 1 to 8 provides a holding mechanism of a contactor, which permits detachably holding a contactor having a large number of, for example, bump type probes formed therein and which also permits improving the accuracy of inspection.

On the other hand, the present invention as defined in claims 9 to 14 provides an automatic renewing mechanism of a contactor, which permits automatically mounting a contactor to and detaching the contactor from a holding mechanism of the contactor and which also permits improving the through-put of the inspection.

It is of no difficulty for those skilled in the art to think of other features and alternations of the present invention. Therefore, the present invention is based on a broader view point and is not limited to the detailed description herein and the typical examples included in the detailed description. It follows that, in the interpretation and range of the broad inventive concept defined in the accompanying claims and equivalent thereof, various modifications can be achieved without departing from the range of the present invention.

What is claimed is:

1. A holding mechanism of a contactor in an inspecting apparatus, comprising:
   the contactor;
   a frame fixed to a board;
   a plurality of latch mechanisms for detachably holding said contactor inside said frame; and
   a suction fixing mechanism for fixing the contactor held by said latch mechanisms within the frame by a vacuum suction force.

2. The holding mechanism of the contactor according to claim 1, wherein said board is a performance board of the inspecting apparatus.

3. The holding mechanism of the contactor according to claim 2, further comprising an interface board mounted within the frame for electrically connecting the performance board to the contactor.

4. The holding mechanism of the contactor according to claim 1, wherein said frame is a ring-like frame.

5. The holding mechanism of the contactor according to claim 4, further comprising an interface board mounted within the frame for electrically connecting the performance board to the contactor.

6. The holding mechanism of the contactor according to claim 1, wherein said latch mechanism comprises a latch ball and an elastic member for elastically supporting said latch ball, and said contactor comprises a plurality of concavities for engagement with said latch ball.

7. The holding mechanism of the contactor according to claim 6, further comprising an interface board mounted within the frame for electrically connecting the performance board to the contactor.

8. The holding mechanism of the contactor according to claim 1, wherein said latch mechanism comprises a latch member that can be projected and retreated and a latch operating mechanism for allowing the latch member to be projected and retreated, and said contactor comprises a plurality of engaging sections formed on the circumferential surface for engagement with said latch member.

9. The holding mechanism of the contactor according to claim 8, further comprising an interface board mounted within the frame for electrically connecting the performance board to the contactor.

10. The holding mechanism of the contactor according to claim 1, wherein said contactor comprises a plurality of hook-shaped projections formed on a circumferential surface, and said latch mechanism comprises a latch member engaged with said hook-shaped projections of the contactor and a latch operating member for releasing the engagement of said latch member.

11. The holding mechanism of the contactor according to claim 10, further comprising an interface board mounted within the frame for electrically connecting the performance board to the contactor.

12. The holding mechanism of the contactor according to claim 1, wherein said latch mechanism comprises a latch member supporting said contactor at its lower surface and a latch operating member for retreating the latch member from the lower surface of the contactor so as to release the support of the contactor.

13. The holding mechanism of the contactor according to claim 12, further comprising an interface board mounted within the frame for electrically connecting the performance board to the contactor.

14. An automatic renewing mechanism of a contactor in an inspecting apparatus, comprising:
   a holding mechanism for detachably holding the contactor; and
   a delivery mechanism for delivering the contactor to and from said holding mechanism, said delivery mechanism including at least one arm that is mounted movable and at least one holding section mounted to said arm for detachably holding said contactor.

15. The automatic renewing mechanism of the contactor according to claim 14, wherein said holding mechanism comprises:
   the contactor;
   a frame fixed to a board;
   a plurality of latch mechanisms for holding said contactor inside said frame; and
   a suction fixing mechanism for fixing the contactor held by said latch mechanisms within the frame by a vacuum suction force.

16. The automatic renewing mechanism of the contactor according to claim 14, wherein said arm in said delivery mechanism is mounted swingable and movable in a vertical direction.

17. The automatic renewing mechanism of the contactor according to claim 14, wherein said holding section in said delivery mechanism detachably holds the contactor by a vacuum suction force.

18. The automatic renewing mechanism of the contactor according to claim 14, wherein a plurality of holding sections are arranged in said delivery mechanism to form an arcuate arrangement along the swinging direction of the delivery mechanism.

19. A holding mechanism of a contactor in an inspecting apparatus, comprising:

the contactor;

means for holding said contactor having a frame fixed to a performance board;

a plurality of latch means for detachably holding said contactor inside said frame; and suction fixing means for fixing the contactor held by said latch means inside the frame by a vacuum suction force.

20. An automatic renewing mechanism of the contactor, comprising:

a holding mechanism of the contactor including a ring-like frame fixed to a performance board, a latch mechanisms for holding said contactor inside said frame, a suction fixing mechanism for fixing the contactor held by said latch mechanism inside the frame by a vacuum suction force, and an interface board mounted inside the frame for electronically connecting the performance board to the contractor; and an automatic renewing mechanism of the contractor including a delivery mechanism having an arm mounted swingable and movable in a vertical direction for delivering the contractor to and from said holding mechanism and at least one holding section mounted to said arm for detachably holding the contractor by a vacuum suction force.

* * * * *